(12) United States Patent
Kuperman et al.

(10) Patent No.: US 6,456,094 B2
(45) Date of Patent: Sep. 24, 2002

(54) CAPACITIVE VOLTAGE DIVIDER FOR MEASURING HIGH VOLTAGE PULSES WITH MILLISECOND PULSE DURATION

(75) Inventors: Grigory Kuperman, Karlsruhe; Klaus-Peter Jungst, Stutensee; Heinrich Salbert, Saarwellingen, all of (DE)

(73) Assignee: Forschunjszentrum Karlsruhe GmbH, Karlsruhe (DE)

( * ) Notice: Subject to any disclaimer, the term of this patent is extended or adjusted under 35 U.S.C. 154(b) by 89 days.

(21) Appl. No.: 09/766,393

(22) Filed: Jan. 22, 2001

Related U.S. Application Data

(63) Continuation-in-part of application No. PCT/EP99/04772, filed on Jul. 7, 1997.

(30) Foreign Application Priority Data

Jul. 23, 1998 (DE) .......................... 198 33 179
May 20, 1999 (DE) .......................... 199 23 211

(51) Int. Cl.$^7$ ............................................. C01R 27/26
(52) U.S. Cl. ........................................ 324/676; 324/658
(58) Field of Search .......................... 250/207; 324/107, 324/126, 547, 658, 676; 331/25

(56) References Cited

U.S. PATENT DOCUMENTS 3,011,123 A    11/1961 Povery .................... 324/76.83
3,806,682 A  * 4/1974  Mauthe et al. ................. 218/79
4,580,094 A  * 4/1986  Siegenthaler ................ 324/126
4,617,513 A  * 10/1986 Reinhardt .................... 324/126
4,739,254 A  * 4/1988  Henery et al. ............... 324/126
5,166,600 A  * 11/1992 Gorablenkow .............. 324/126
5,469,050 A  * 11/1995 Lorenz et al. ............... 324/126
5,991,177 A  * 11/1999 Kaczkowski .................. 363/62

FOREIGN PATENT DOCUMENTS

DE          220 704 A1    4/1985    ........... G01R/15/16

* cited by examiner

*Primary Examiner*—N. Le
*Assistant Examiner*—Walter Benson
(74) *Attorney, Agent, or Firm*—Klaus J. Bach

(57) ABSTRACT

In a capacitive voltage divider for measuring high voltage pulses with millisecond pulse duration comprising a high voltage divider including a first cascade of at least two serially arranged condensers of which one (C1) is disposed at the high potential end and another (C2) is disposed at the low potential end of the cascade, and a measuring voltage divider connected to the other condenser (C2) and including a second cascade of at least first and second serially arranged condensers (C3, C4) arranged, respectively, at the high and low potential ends of the second cascade with the second condenser being connected with its low voltage side to a signal supply line leading to a measuring device, and an ohmic resistor (R1) arranged in parallel with the first condenser and a resistance (R2) connected to the one and first condensers in parallel with the second condenser (C4), the ohmic resistor (R1) is so dimensioned that $1.1 < C4 \ast R2/C3 \ast R1 < 1.15$.

8 Claims, 2 Drawing Sheets

Prior Art

CAPACITIVE VOLTAGE DIVIDER FOR MEASURING HIGH VOLTAGE PULSES WITH MILLISECOND PULSE DURATION This is a continuation-in-part application of international application PCT/EP99/04772 filed Jul. 7, 1999 and claiming the priorities of German applications 198 33 179.7 filed Jul. 23, 1998 and 199 23 211.3 filed May 2, 1999.

BACKGROUND OF THE INVENTION

The invention resides in a capacitive voltage divider for measuring high voltage pulses with millisecond impulse duration.

For measuring high voltage pulses in the nano- and microsecond range, simple capacitive voltage dividers are used. The high voltage part of such a divider consists generally of at least one cylindrical condenser, which is disposed within a pressurized insulating gas or an insulating oil. Depending on the desired divider ratio K, the low voltage part of the high voltage divider may be disposed in the same space as the high voltage part (about K<100) or it may be arranged separately therefrom (about K≧100). With commercially manufactured condensers, the voltage divider is generally designed in one or the other of these ways.

In a design in which the capacitive voltage divider is spacially separated into a high voltage and a low voltage part, the capacities often change during operation by the heating of the dielectric material.

In contrast, with an encapsulation in a common dielectric structure the ratio of the capacities $C_1/C_2$ does not change, that is, $C_1/C_2$ remains constant. The measuring error occurring with temperature changes may well be several percent. This problem of temperature-dependent capacities can be essentially eliminated by avoiding the spatially separated arrangements.

In a publication of the Academy of the Sciences of the USSR, Testing Arrangements and Techniques, Vol. 3, Moscow, 1985, G. Kuperman et al., disclose under the title "High Power Precision Pulse Modulator" a capacitive voltage divider, whose high voltage divider comprises a series arrangement of condensers C1 and C2. The condensers C1 and C2 are all disposed in transformer oil so that the temperature effect is suppressed. The measurement voltage divider comprises two condensers C3 and C4 arranged in series and is connected to the high potential contact of the condenser C2. The potential between the two condensers C3 and C4 is supplied to a measuring instrument with an input resistance R4, for example, an oscilloscope. If the capacity of the low voltage part C2 at the high voltage divider is substantially higher than the capacity of the upper condenser C3 in the measuring voltage divider, that is if C3<<C2, a divider ratio is obtained as follows:

$$K \approx ((C2+C3) \cdot C4)/(C1 \cdot C3)$$

Such a high voltage divider arrangement is simple and reliable and has a high temperature stability. It is suitable for measuring high voltage pulses, which have durations in the microsecond and nanosecond ranges. However, it is not suitable for measuring pulses in the millisecond range since, at the end of a 1.5 msec pulse, the measuring error may reach 15% and even more.

DE 41 40 506 A1 discloses a high voltage sensing head with a large frequency range. The measuring arrangement consists of a capacitive voltage divider comprising a high voltage cascade and a measuring cascade of condensers wherein the measuring cascade senses the voltage at the lowermost condenser of the high voltage cascade. The voltage signal is supplied to the lowermost condenser of the measuring cascade of the measuring instrument. A resistor, which bridges the upper condenser of the measuring cascade has the same resistance as, that is a resistance corresponding to, the wave resistance of a co-axial cable, that is 50 Ω, to obtain an optimal termination for the co-axial cable. The resistor dimensioned in this way has a pure termination function for the signal line. The deviations of the measuring signal obtained thereby from the actual measuring signal, which are proportional to the divided high voltage pulse signal, are substantial, particularly in this msec range. The signal is therefore not useable for control and monitoring tasks.

It is the object of the present invention to provide an arrangement by which the time-dependent value of high voltage pulses with pulse durations in the millisecond range can be precisely measured.

SUMMARY OF THE INVENTION

In a capacitive voltage divider for measuring high voltage pulses with millisecond pulse duration comprising a high voltage divider including a first cascade of at least two serially arranged condensers of which one (C1) is disposed at the high potential end and another (C2) is disposed at the low potential end of the cascade, and a measuring voltage divider connected to the other condenser (C2) and including a second cascade of at least first and second serially arranged condensers (C3, C4) arranged respectively, at the high and low potential ends of the second cascade with the second condenser being connected with its low voltage side to a signal supply line leading to a measuring device and an ohmic resistor (R1) arranged in parallel with the first condenser and a resistance (R2) connected to the one and first condensers in parallel with the second condenser (C4), the ohmic resistor (R1) is so dimensioned that $$1.1 < C4 R2/C3 R < 1.15.$$

The capacitive voltage divider design as it is known from the state of the art and which is suitable for the microsecond range is utilized for the arrangement according to the invention because of its simplicity and reliability. It is modified however in a simple manner to make it suitable for larger time windows. The object to measure precisely also high voltage pulses with pulse durations in the millisecond range is achieved by arranging a suitably dimensioned ohmic resistor R1 in parallel with the condenser C3.

The ohmic resistor is selected such that $$1.1 < C4 R2/C3 R1 < 1.15.$$

With this arrangement, the accuracy of the voltage measurement with a pulse duration in the millisecond range is improved from presently about ±7.5%—depending on the component dimensioning—to less than ±0.02%, while maintaining the temperature stability of the capacitive high voltage dividers built in accordance with today's state of the art.

The representative resistance R2 is characterized by various possible circuit arrangements. They depend on the needs of the measuring techniques. They include a circuit arrangement for suppressing undesired oscillations during the rapid voltage increase of the high voltage pulse. It is materialized by arranging an ohmic resistor R3 in connection with a co-axial cable in the input line to the measuring instrument.

Preferably, the high voltage cascade is disposed in a dielectric medium at least up to the condenser with the lowest potential. With an appropriate containment, the dielectric medium of the cascade of the high voltage divider may be pressurized particularly with a compact structure, which provides for high dielectric strength.

The advantage of such a voltage divider is that immediately after applying a rectangular high voltage pulse the voltage at the input of the measuring instrument or the measuring amplifier is determined by the ratio of the capacities in the high voltage divider. The accuracy of the voltage measurement at the end of the rectangular pulse with millisecond duration is improved by the dimensioning of the resistor above the upper condenser in the measuring voltage divider by orders of magnitude.

Below an embodiment of the invention will be described in detail on the basis of the accompanying drawings.

DESCRIPTION OF A PREFERRED EMBODIMENT

Figure 1:
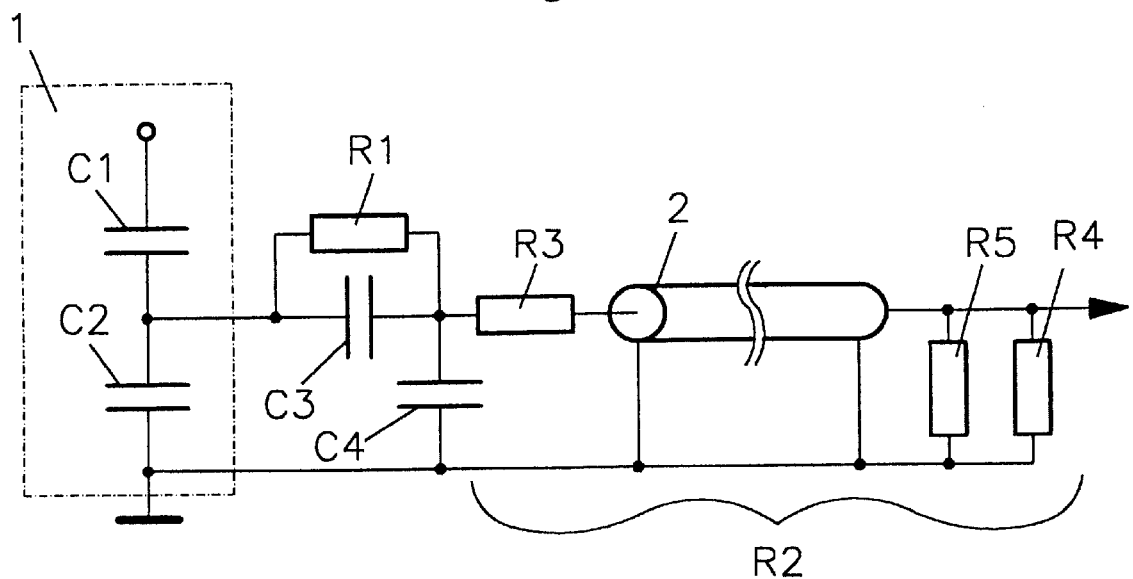
FIG. 1 shows a capacitive voltage divider, which is modified for a millisecond pulse duration.

As shown in FIG. 1, the high voltage part 1 of the high voltage divider comprises one or—depending on the dielectric strength—at least two condensers C1, which are arranged in series. They are usually disposed in a pressurized insulating gas or insulating oil such as transformer oil or another suitable insulating medium. The low voltage part C2 is for example a plate condenser which is disposed in the same compartment as the high voltage part 1. In this way, the cascade C1, C2 of the high voltage divider is exposed everywhere to the same temperature such that there is no effect caused by different temperatures.

The measuring voltage divider comprises a cascade of serially arranged commercially available condensers C3 and C4 disposed in the circuit between the common potential point of the condensers C1 and C2 and the reference potential. I this case the reference potential is ground potential to which also the high voltage divider is connected.

Figure 2:
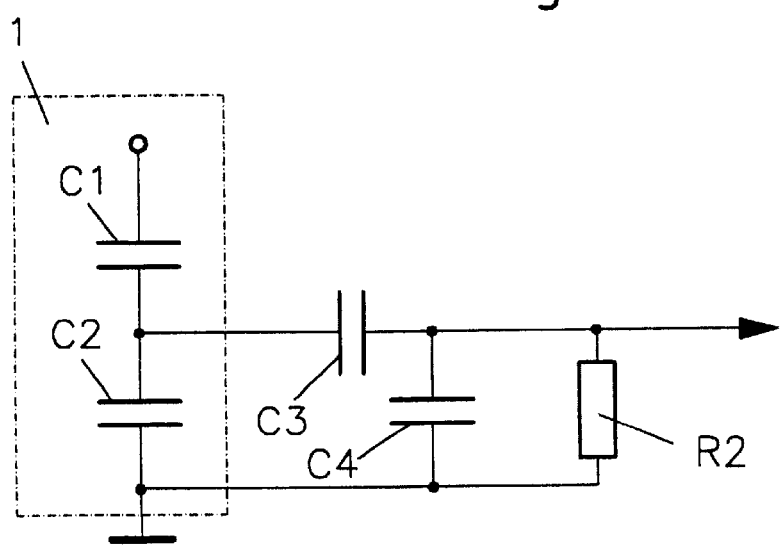
FIG. 2 shows a capacitive voltage divider for a pulse duration in the nano- and microsecond range as it is known in the art.

Basically, the high voltage divider comprises the pure capacitive voltage divider according to FIG. 2 as it is known to be suitable for nano- and microsecond pulse durations. In this arrangement however a resistor R1 (correction resistor) is disposed in parallel with the condenser C3. The bridging condenser is so dimensioned that the ratio of the product of the capacity of the condenser C4 of the measurement voltage divider C3, C4 and the input resistor R4 to the product of the capacity of the condenser C3 at the measurement voltage divider C3, C4 and the bridging resistor R1 is between 1.1 and 1.15, that is:

$$1.1 < (C4 \times R2)/(C3 \times R1) < 1.15$$

Herein, the representative resistance R2 may also be a parallel circuit arrangement formed by the input resistance of the measuring instrument and the correction resistor R5 arranged in parallel therewith.

Below, the voltage divider will be considered analytically in greater detail in order to point out its suitability and advantages. To this end, the actual measuring setup is shortly explained in order to make the parameter selection apparent: The capacity of C4 represents actually the capacity of the lower measuring voltage divider C3, C4 and the capacity of the coaxial cable 2 and also of the measuring instrument input, that is, in this case, of the oscilloscope input. The parallel resistors R5, also a correction resistor for the simple tuning of the voltage divider and for improving at the same time the measuring accuracy, and R2 as the input resistance of the oscilloscope as well as the serial resistor 3 for the attenuation of oscillations during rapid voltage changes for example with the rising flank of a square wave, are represented by the resistor R2. The applied high voltage is a square voltage which suddenly jumps to 100 kV and remains at this level for such a long period that the raise and drop periods can be considered to be zero.

In the complex domain, the result is a voltage of the form:

$$U(p) = (a+bp)/(p^2+mp+n) \text{ with}$$

$$a = 10^5 C1/[R1C3(C4+C1+C2)+R1C4(C1+C2)],$$

$$b = 10^5 C1/[C3(C4+C1+C2)+C4(C1+C2)],$$

$$m = [R1(C1+C2+C3)+R2(C1+C2+C4)]/\{R1R2[C3(C4+C1+C2)+C4(C1+C2)]\},$$

$$n = 1/\{R1R2[C3(C4+C1+C2)]\},$$

Back in the time domain, the following voltage is obtained:

$$U(t) = e^{-\alpha t}(a-b\alpha)/(\beta-\alpha) - e^{-\beta t}(a-b\beta)/(\beta-\alpha), \text{ with}$$

$$\alpha = 0.5\ m - (0.25\ m^2 - n)^{0.5} \text{ and}$$

$$\beta = 0.5\ m - (0.25\ m^2 - n)^{0.5}$$

For the design of the components, the following set of dimensions can be determined therefrom:

$$C1 = 12.4 \times 10^{-12}\ F,$$

$$C2 = 900 \times 10^{-12}\ F,$$

$$C3 = 94 \times 10^{-12}\ F,$$

$$C4 = 22.8 \times 10^{-9}\ F,$$

$$R1 = 84 \times 10^6\ \Omega, \text{ and}$$

$$R2 = 385.4 \times 10^3\ \Omega.$$

The time-dependent voltage value at the output of the voltage divider has for this dimensioning example, the following optimal time dependency:

$$U(t) = 5.71 * e^{-11.79t} - 0.69 * e^{-112.9t}$$

There is a maximum. The best approximation (Tschebyscheff-approximation) to the actually constant voltage part plot is obtained when the maximum is disposed within the time interval, and the values at the beginning and the end of the measured pulse are the same.

Figure 3:
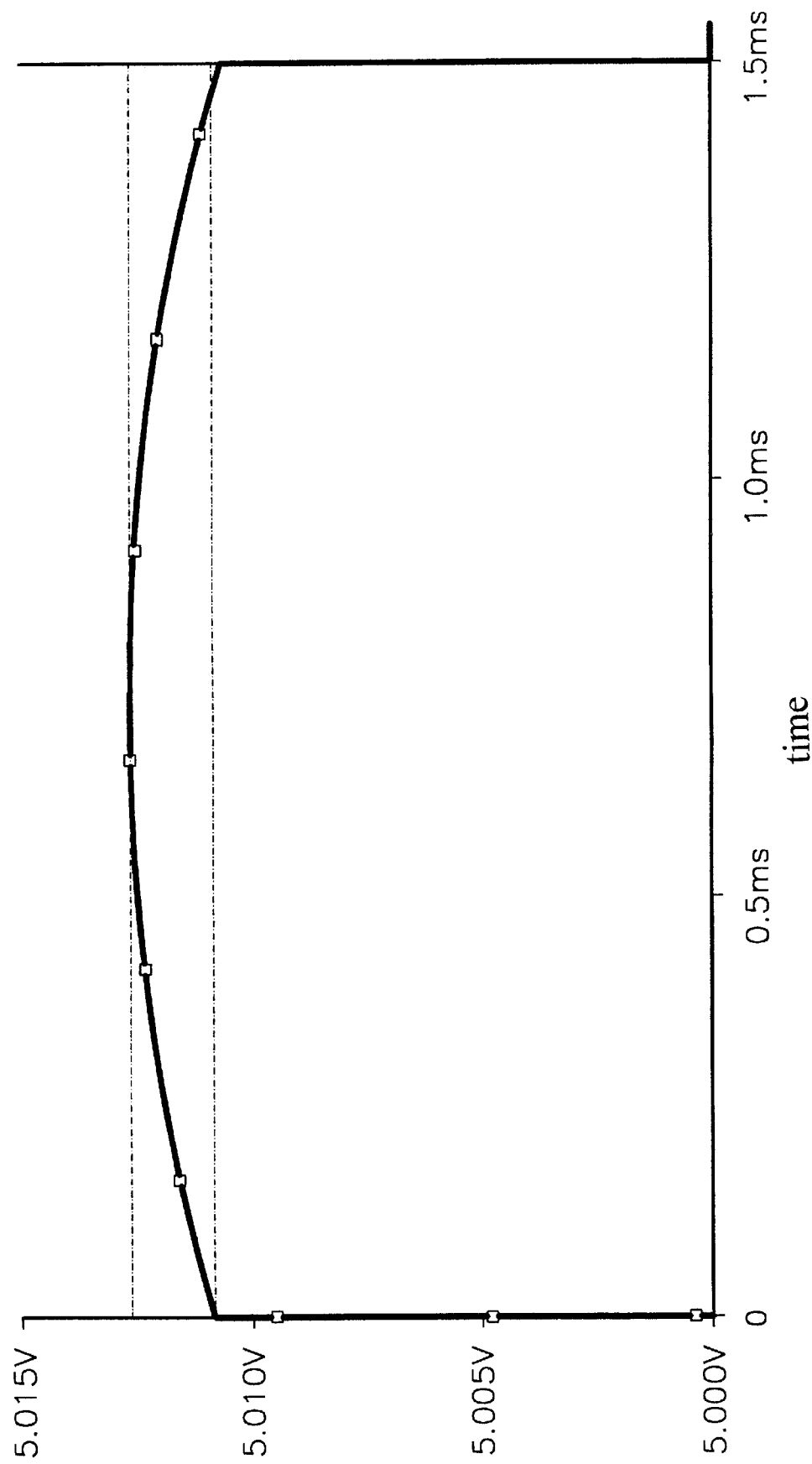
FIG. 3 shows a curve indicating the time-dependent voltage measured by an oscilloscope upon application of a square high-voltage pulse on the optimized voltage divider according to the invention.

FIG. 3 shows the measuring voltage at the oscilloscope plotted over time wherein the voltage values, which were detected at the voltage divider dimensioned in accordance with the values given above. The pulse duration of 1.46 msec. leads to the desired optimal result. The error is not greater than ±0.02%. The error obtained with the state of the art arrangements is 15%(±7.5%). The improvement over this result is more than two orders of magnitude.

The voltage at the input of the oscilloscope can, at the point in time of the end of the square input pulse for the time conditions, be so adjusted by the selection of the dimensions that it is at the beginning of the pulse. Furthermore, the form of the measured pulse top at the oscilloscope upon application of the square high voltage pulse is not mainly determined by the time constant R2C4 (R2 is the substitute resistance parallel to the condenser C4, which represents the resistance of the co-axial cable 2 leading to the measuring instrument and the input resistance thereof). Rather, the pulse form from the ratios of the capacities of the condensers and the ratio of the resistances (R1/R2) is obtained. This is important for the accuracy, since the time constant R2C4 can generally not be selected sufficiently large. In the following table, examples for the capacitive voltage divider for measuring high voltage pulses with millisecond pulse durations are presented:

TABLE

| Lfd Nr. | C1 pF | C2 nF | C3 pF | C4 nF | R1 MΩ | R2* kΩ | $\tau_1$ ms | $\tau_2$ ms | $\tau^{*}_2/\tau^{}_1$ ms | $\tau_1$ ms | δu % |
|---|---|---|---|---|---|---|---|---|---|---|---|
| 1 | 12,4 | 0,9 | 94 | 22,8 | 84 | 385,4 | 7,896 | 8,787 | 1,113 | 1,5 | ±0,018 |
| 2 | 14,26 | 0,9 | 94 | 26,22 | 84 | 335,13 | 7,896 | 8,78 | 1,112 | 1,5 | ±0,014 |
| 3 | 6,0 | 0,04 | 47 | 11,4 | 159 | 741 | 7,473 | 8,45 | 1,131 | 3,6 | ±0,1 |
| 4 | 15 | 0,9 | 94 | 27,2 | 200 | 770 | 18,8 | 20,94 | 1,114 | 4,0 | ±0,02 |
| 5 | 15 | 0,9 | 96 | 27,3 | 210,4 | 830 | 20,2 | 22,66 | 1,122 | 6,2 | ±0,95 |
| 6 | 12,4 | 0,9 | 94 | 22,8 | 159 | 741 | 14,9 | 16,89 | 1,134 | 7,2 | ±0,1 |
| 7 | 12,4 | 0,9 | 94 | 22,8 | 170,5 | 800 | 16,027 | 18,24 | 1,138 | 10 | ±0,02 |

R2* = R4*R5/(R4+R5)
$\tau_1$** = R1*C3
$\tau_2$*** = R2*C4

Normally, the capacity of the high voltage capacitor C1 for the surveillance of pulse voltages higher than 100 kV is about 6 to 15 pF. The input capacity of the electronic measuring instrument such as an oscilloscope is generally 20 to 30 pF and the input resistance is 1 MΩ. The capacity of the cable is included in the capacity of C4. In the present case, a 50 Ω coaxial cable is assumed which may have a length of up to 100 m. From the table, the effects of the selection of the dimensions are apparent: When observing the given component dimensioning the voltage variations at the top of the pulse are within the limits ±0,1%.

The dimensioning of the capacity of the condensers in the voltage divider is determined by the desired divider ratio K. In this way, only the value of the resistor R1 in the measurement voltage divider C3, C4 and representative input resistance R2 of the device connected to the measurement voltage divider for the representation of the measuring voltage can be freely selected. By suitable selection of these values, an improvement of the measuring accuracy by 2 to 3 orders of magnitude is obtained with the modified capacitive voltage divider in comparison with the state of the art while the temperature stability is maintained.

Basically, the changes to the circuit require hardly any expenses. They can furthermore be applied to different time windows in the millisecond range by different dimensioning. Additional improvements can be achieved by arranging the resistors R3 in series with the co-axial cable 2 (attenuation of oscillations during a rapid voltage increase) and providing the resistor R5 (timing of the supply cable to the measuring instrument). This is a measure commonly used for a stationary measuring arrangement.

What is claimed is:

1. A capacitive voltage divider for measuring high voltage pulses with millisecond pulse duration, comprising:
   a high voltage divider including a first cascade of at least two serially arranged condensers,
   one of said condensers (C1) being disposed at the high potential end and another condenser (C2) being disposed at the low potential end of the high voltage divider cascade,
   a signal supply line connected to the voltage end of said first cascade and leading to a measuring device,
   a measuring voltage divider connected to said other condenser (C2) and consisting of a second cascade of at least first and second serially arranged condensers of which said first condenser (C3) is arranged at the high potential end and the second condenser (C4) is arranged at the low potential end of the second cascade,
   said second condenser (C4) being connected with its low voltage side also to said signal supply line,
   an ohmic resistor (R1) arranged in parallel with said first condenser, and
   a resistance (R2) represented by the input resistance of the measuring device connected to said one and first condensers in a parallel circuit to said second condenser (C4),
   said ohmic resistor (R1) being so dimensioned that the ratio of the product of the capacity of the condenser (C4) and the resistance value of the resistance R2 to the product of the capacity of the first capacitance (C3) and the resistance value of the one resistor (R1) is between 1.1 and 1.15, that is:

$$1.1 < C4*R2/C3*R1 < 1.15.$$

2. A voltage divider according to claim 1, wherein said resistance (R2) represents the input resistance of the measuring instrument.

3. A voltage divider according to claim 1, wherein said resistance (R2) represents a parallel circuit arrangement including said input resistance of said measuring instrument and a correction resistor.

4. A voltage divider according to claim 3, wherein said dielectric medium is an insulating gas.

5. A voltage divider according to claim 3, wherein said dielectric medium is a casting resin.

6. A voltage divider according to claim 1, wherein a coaxial cable extends to said measuring instrument and a resistor (R3) is arranged in series with said coaxial cable and a correction resistor (R5) and an input resistor (R4) are arranged in parallel with said second condenser (C4).

7. A voltage divider according to claim 1, wherein said high voltage divider is disposed in a pressurized dielectric medium.

8. A voltage divider according to claim 7, wherein said dielectric medium is an insulating oil.

* * * * *